United States Patent
Watanabe et al.

(10) Patent No.: US 6,249,194 B1
(45) Date of Patent: Jun. 19, 2001

(54) COMPOSITE FILTER COMPRISING LC AND SAW FILTERS AND RADIO COMMUNICATION APPARATUS USING THE FILTER

(75) Inventors: Takahiro Watanabe, Shiga-ken; Norio Nakajima, Takatsuki; Akihiro Ochii, Shiga-ken, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/191,041

(22) Filed: Nov. 12, 1998

(30) Foreign Application Priority Data

Nov. 13, 1997 (JP) .................................................. 9-312285

(51) Int. Cl.$^7$ ............................. H01P 1/213; H03H 7/01; H03H 9/64
(52) U.S. Cl. ......................... 333/133; 333/175; 333/185; 333/193
(58) Field of Search .................................. 333/133, 175, 333/185, 193–196

(56) References Cited

U.S. PATENT DOCUMENTS

| | | | |
|---|---|---|---|
| 5,410,742 | * | 4/1995 | Yajima ............................. 333/193 X |
| 5,525,942 | * | 6/1996 | Horii et al. .......................... 333/134 |
| 5,815,052 | * | 9/1998 | Nakajima et al. ................ 333/185 X |
| 6,025,761 | * | 2/2000 | Watanabe et al. ................ 333/193 X |

FOREIGN PATENT DOCUMENTS

| | | |
|---|---|---|
| 19633954 | 2/1997 | (DE) . |
| 0638953 | 2/1995 | (EP) . |
| 0 747 988 A1 | * 12/1996 | (EP) . |
| 3-220911 | * 9/1991 | (JP) . |
| 9-098056 | * 4/1997 | (JP) . |
| 10-032521 | * 2/1998 | (JP) . |
| 10-145270 | * 5/1998 | (JP) . |
| 10224174A | 8/1998 | (JP) . |

OTHER PUBLICATIONS

Patent Abstracts of Japan, vol. 1998, No. 13, Nov. 30, 1998.

* cited by examiner

*Primary Examiner*—Robert Pascal
*Assistant Examiner*—Barbara Summons
(74) *Attorney, Agent, or Firm*—Ostrolenk, Faber, Gerb & Soffen, LLP

(57) ABSTRACT

A composite filter, with a laminated body formed by laminating a dielectric layer and an electric conductor layer; a concave portion provided on at least one major surface of said laminated body; external terminals provided on at least a side surface of said laminated body; an LC filter made of an inductance element and a capacitance element respectively formed by said electric conductor layer of said laminated body; a surface acoustic wave filter arranged in said concave portion of said laminated body; a cover sealing said concave portion; two of said external terminals constituting the input terminals of said surface acoustic wave filter and of said LC filter respectively and two of said external terminals constituting the output terminals of said surface acoustic wave filter and of said LC filter respectively; and said surface acoustic wave filter and said LC filter are independent without being connected to each other in said laminated body. The above composite filter has a reduced number of parts and a simpler assembly process. A radio communication apparatus can advantageously use the disclosed composite filter.

15 Claims, 7 Drawing Sheets

COMPOSITE FILTER COMPRISING LC AND SAW FILTERS AND RADIO COMMUNICATION APPARATUS USING THE FILTER

BACKGROUND OF THE INVENTION

1. Field of the Invention

The present invention relates to a composite filter and a radio communication apparatus. In particular, the present invention relates to a composite filter comprising a surface acoustic wave filter and an LC filter, and a radio communication apparatus using the composite filter.

2. Description of Related Art

In FIG. 8, a RF block diagram of a portable telephone terminal which is an example of a general radio communication apparatus is shown. The portable telephone terminal operating in a single frequency band such as 800 MHz, 1.5 GHz, etc. includes an antenna ANT, a duplexer for antenna DPX, a transmitting RF portion Tx, a receiving RF portion Rx, and a synthesizer portion SYN. The input portion of the transmitting RF portion Tx is connected to a modulator portion MOD, and the output portion of the receiving RF portion Rx is connected to a demodulator portion DE respectively. The transmitting RF portion Tx is composed of a high output amplifier PA, a buffer amplifier BA, band-pass filters F1, F2, a low-pass filter F3, and a mixer MIX1, and performs a function to output a transmitting signal in receipt from the modulator MOD to the antenna ANT through the duplexer for antenna DPX. On the other hand, the receiving RF portion Rx is composed of a low-noise amplifier LNA, band-pass filters F4, F5, and a mixer MIX2, and caries out a function to output a receiving signal received from the antenna ANT through the duplexer for antenna DPX to the demodulator DE.

And, a conventional portable telephone terminal has been built up in such a way that, although not illustrated, a circuit board made of glass-epoxy resin, ceramics etc., has the various amplifiers PA, BA, LNA formed as chip-parts, a duplexer for antenna DPX made up of dielectric filters, and each of filters F1 through F5 mounted thereon.

However, in the above-mentioned portable telephone terminal making each of the conventional components as a chip-component has led to greater integration and this integration has increased the number of parts and has complicated the assembly process.

SUMMARY OF THE INVENTION

The present invention is provided to overcome the above described problems and provides a composite filter in which the number of components can be reduced and the assembly process of which is made easier. The invention also provides a radio communication apparatus using the composite filter.

A preferred embodiment of the present invention provides a composite filter, comprising: a laminated body formed by laminating a dielectric layer and an electric conductor layer; a concave portion provided on at least one major surface of said laminated body; external terminals provided on at least a side surface of said laminated body; an LC filter made of an inductance element and a capacitance element respectively formed by said electric conductor layer of said laminated body; a surface acoustic wave filter arranged in said concave portion of said laminated body; a cover for sealing said concave portion; two of said external terminals constituting the input terminals of said surface acoustic wave filter and of said LC filter respectively and two of said external terminals constituting the output terminals of said surface acoustic wave filter and of said LC filter respectively; and said surface acoustic wave filter and said LC filter are independent without being connected to each other in said laminated body.

According to the above described composite filter, because a surface acoustic wave filter and an LC filter are integrated through one laminated body, the number of parts can be reduced and the assembly process can be made easy. At the same time, nearly the same function as that of the discrete chip parts is made available.

Further, in nearly the same size as a surface acoustic wave filter made as a conventional discrete chip part, a composite filter having the two functions of a surface acoustic wave filter and an LC filter is made available.

Furthermore, because both a surface acoustic wave filter and an LC filter have their own independent input and output terminals, insertion of other electronic parts is made possible between the surface acoustic wave filter and LC filter. Therefore, the radio communication apparatus to be equipped with a composite filter is able to have the freedom of design widened.

In the above described composite filter, the surface acoustic wave filter and the LC filter may be band-pass filters respectively. If one filter is arranged at a later stage after the other filter, the attenuation value can be made larger at frequencies outside the pass band. Accordingly, the attenuation value can be made large over a relatively wide band.

In the above described composite filter, the pass band of the LC filter may include the pass band of the surface acoustic wave filter. If the LC filter having the pass band wider than that of the surface acoustic wave filter is arranged at a stage after of the surface acoustic wave filter having a narrow pass band, a high-frequency signal passes the LC filter after the high-frequency signal has passed the surface acoustic wave filter and at frequencies outside the pass band of the surface acoustic wave filter the attenuation value can be made even larger. Therefore, the attenuation value can be large over a relatively wide band.

In the above described composite filter, the pass band of the surface acoustic wave filter may not overlap with the pass band of said LC filter. This composite filter can be used when different frequencies are made to pass through. Therefore, the freedom of usage can be widened.

A preferred embodiment of the present invention also provides a radio communication apparatus, comprising: the above described composite filter; and the surface acoustic wave filter and the LC filter constituting the composite filter serving as a filter constituting part of a transmitting RF portion or a filter constituting part of a receiving RF portion.

According to the above described composite filter, because a surface acoustic wave filter and an LC filter constituting a composite filter are used as a filter in a transmitting RF portion or a receiving RF portion, the number of parts constituting a radio communication apparatus can be reduced. Consequently, the radio communication apparatus can be made small-sized.

Other features and advantages of the present invention will become apparent from the following description of an embodiment of the invention which refers to the accompanying drawings.

DETAILED DESCRIPTION OF AN EMBODIMENT OF THE INVENTION

Figure 1:
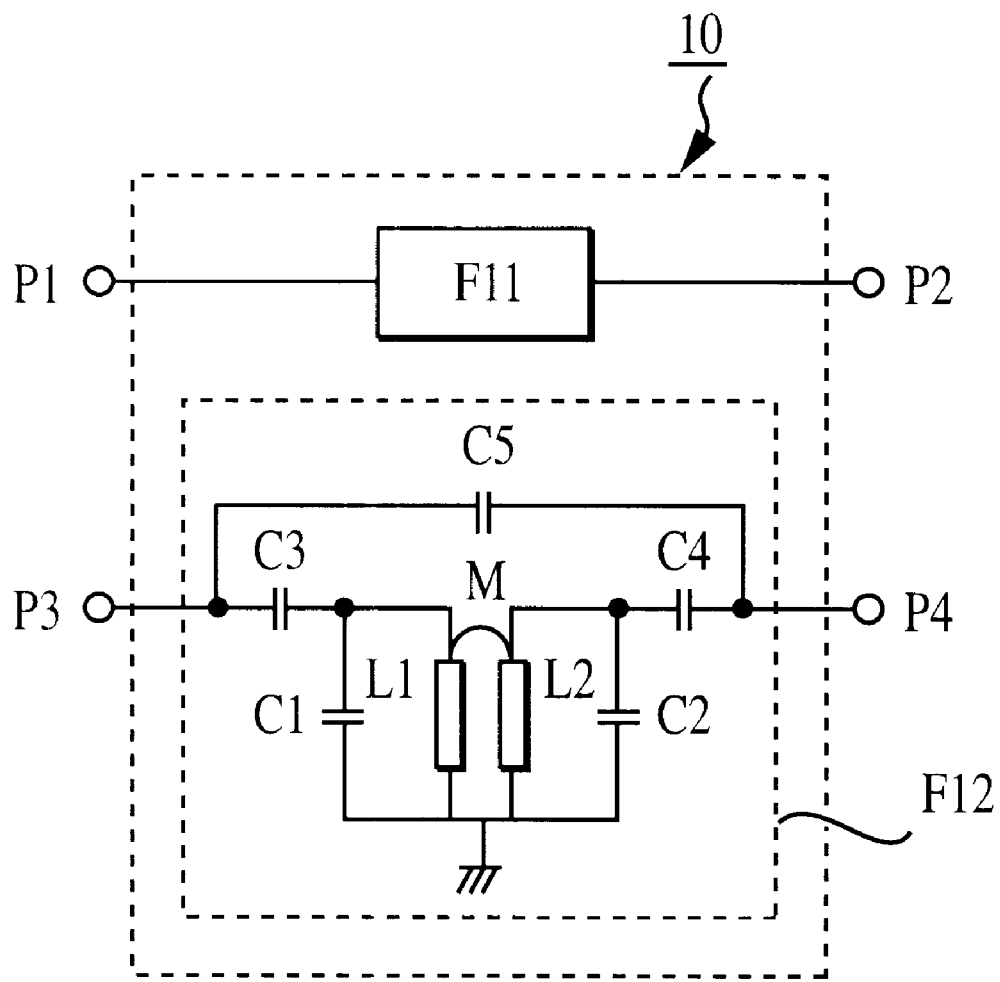
FIG. 1 is a circuit diagram of a preferred embodiment relating to a composite filter according to the present invention.

In FIG. 1, a circuit diagram of a preferred embodiment of a composite filter according to the present invention is shown. A composite filter 10 includes a first through a fourth port, that is, P1 through P4. Between the first port P1 and the second port P2 a surface acoustic wave filter F11 is connected, and between the third port P3 and the fourth port P4 transmission lines L1, L2 as an inductance component and an LC filter F12 having capacitors C1 through C5 as a capacitance component is connected. Both of the surface acoustic wave filter F11 and LC filter F12 are band-pass filters.

Specifically, the LC filter F12 is composed of a resonance circuit of the transmission line L1 and the capacitance C1 both of which are connected in parallel between the third port P3 and the ground, a resonance circuit of the transmission line L2 and the capacitance C2 both of which are connected in parallel between the fourth port P4 and the ground, the capacitance C3 connected between the third port P3 and the connection point of the transmission line L1 and the capacitance C1, the capacitance C4 connected between the fourth port P4 and the connection point of the transmission line L2 and the capacitance C2, and the capacitance C5 connected between the third port P3 and the fourth port P4. At this time, the transmission lines L1 and L2 are coupled under the degree of magnetic coupling M.

Figure 2:
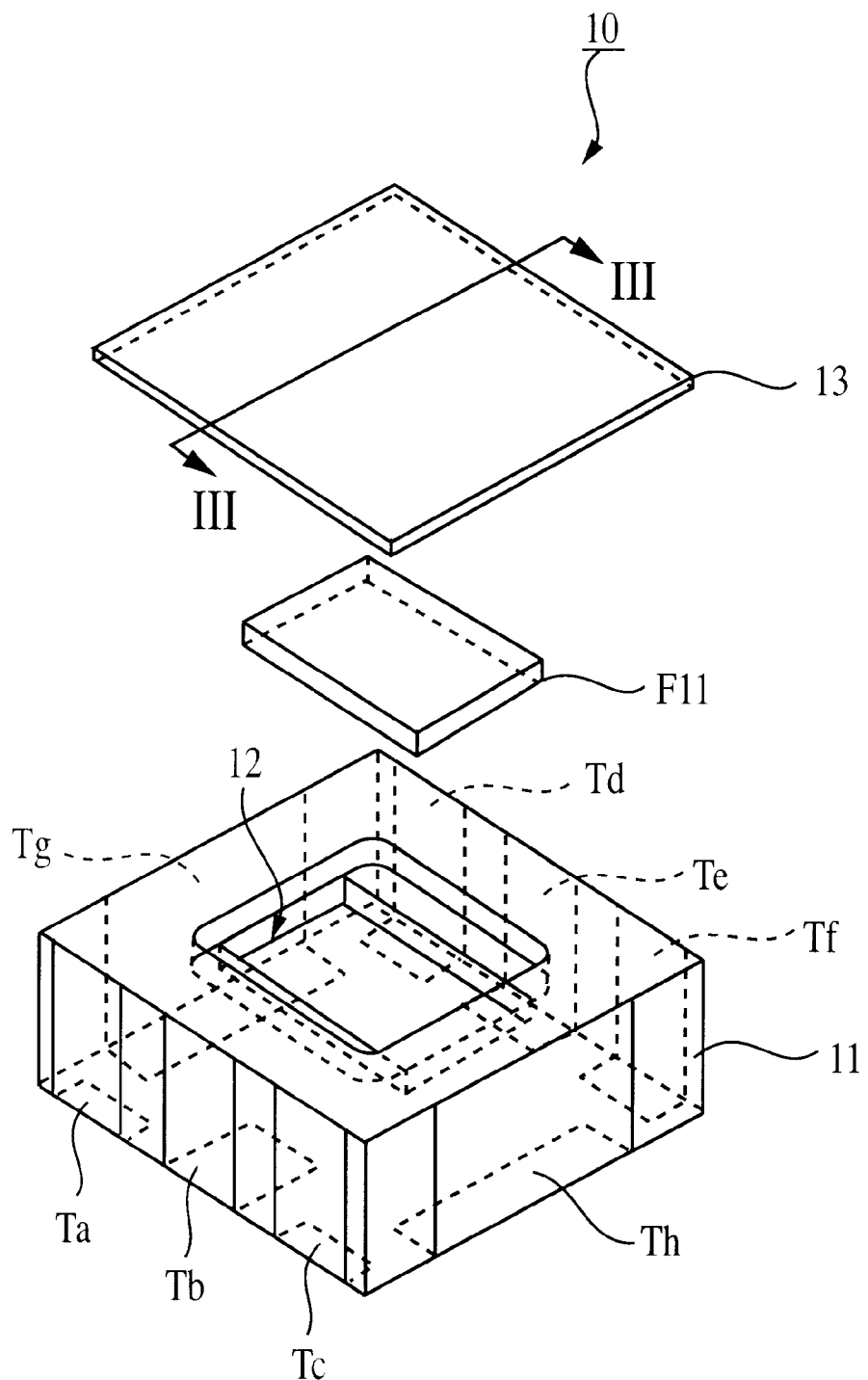
FIG. 2 is an exploded perspective view of the composite filter in FIG. 1.
Figure 3:
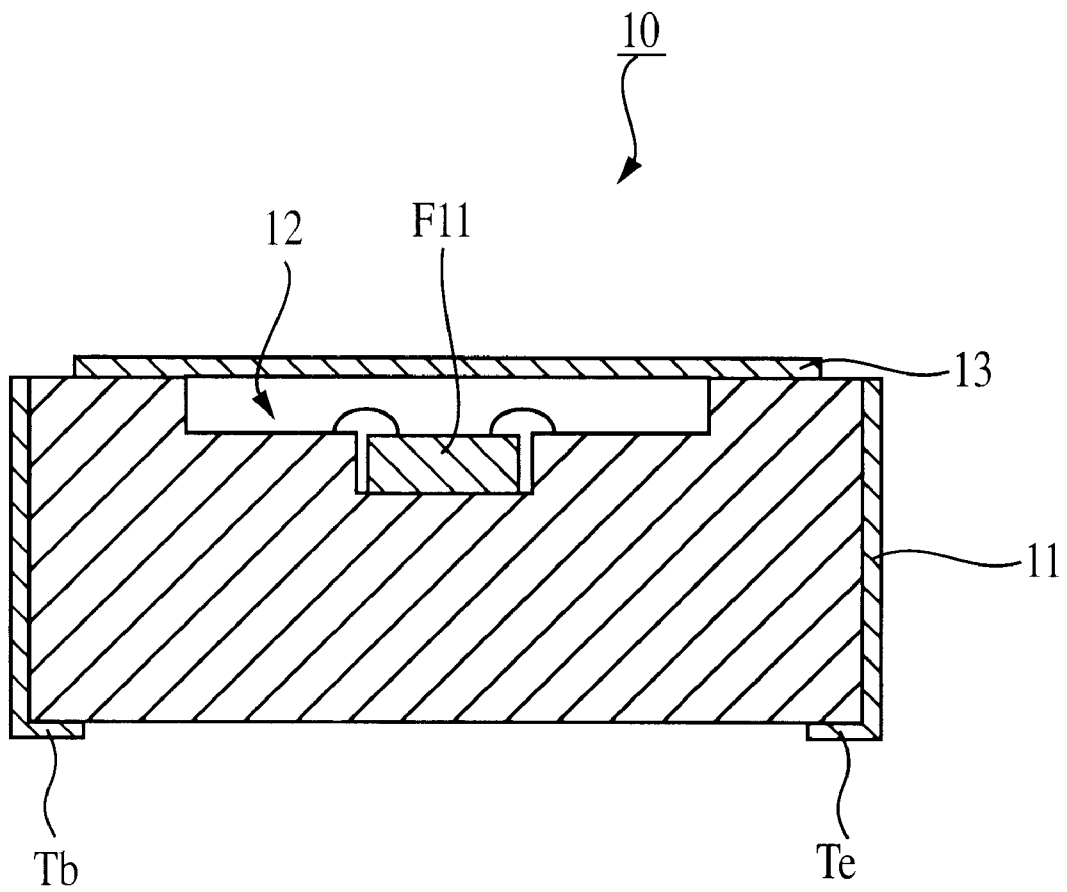
FIG. 3 is a cross-sectional view taken on line III—III of FIG. 2.
Figure 4A:
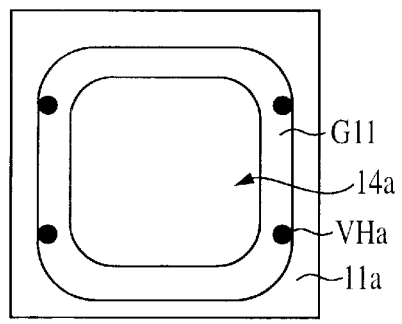
FIGS. 4A to 4H are top plan views of a first dielectric layer through a eighth dielectric layer constituting a laminated body of the composite filter in FIG. 2.
Figure 4B:
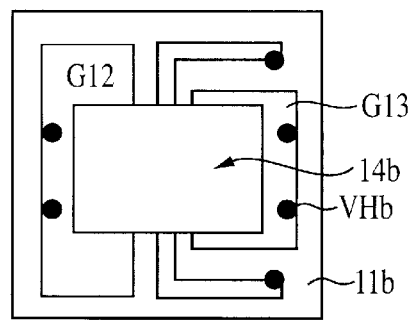
Figure 4C:
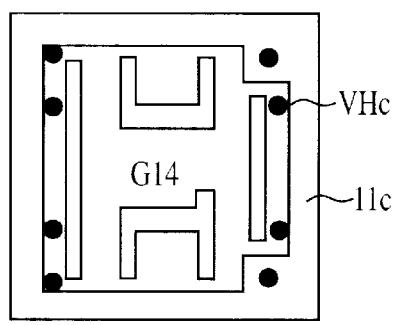
Figure 4D:
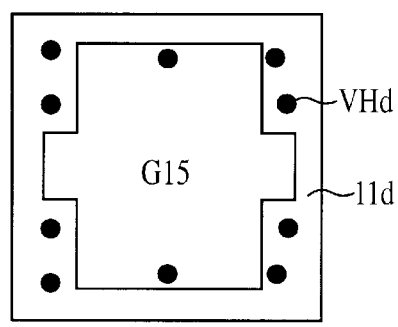
Figure 4E:
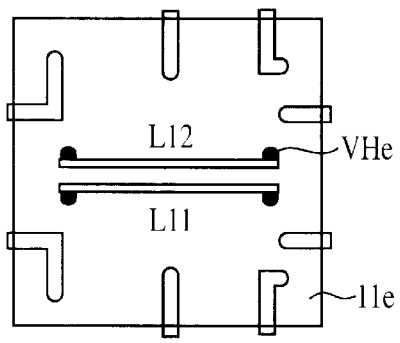
Figure 4F:
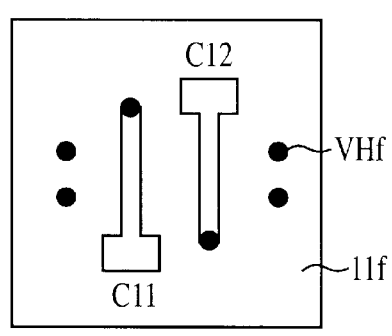
Figure 4G:
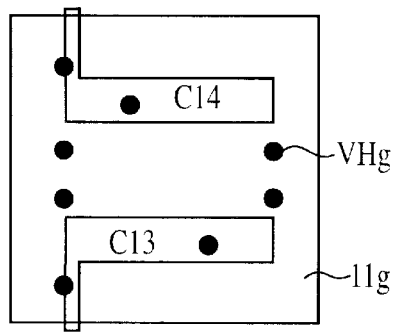
Figure 4H:
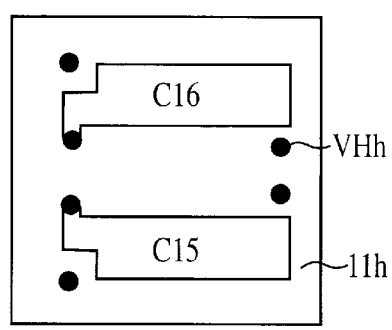
Figure 5A:
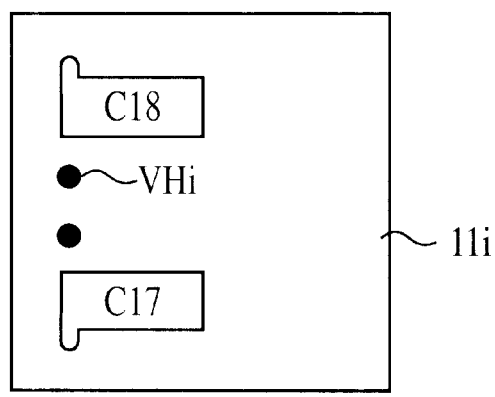
FIGS. 5A to 5E show top plan views of a ninth dielectric layer through a thirteenth dielectric layer constituting a laminated body of the composite filter in FIG. 2.
Figure 5B:
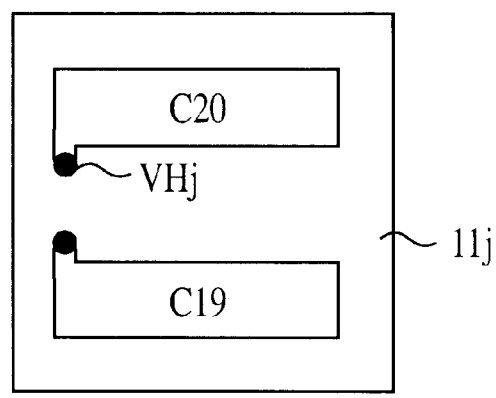
Figure 5C:
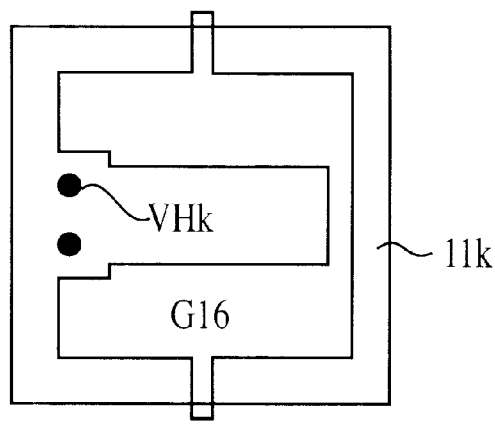
Figure 5D:
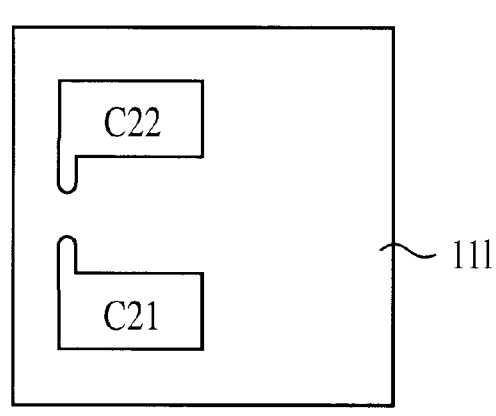
Figure 5E:
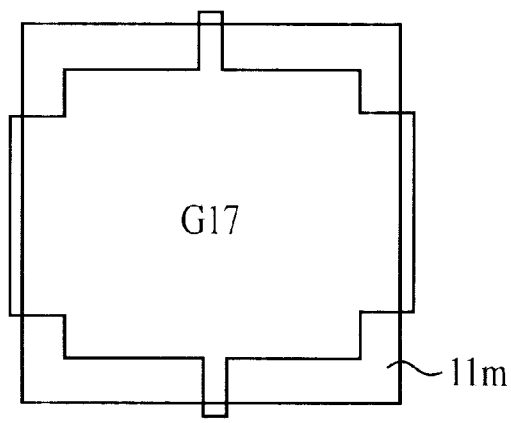
Figure 5F:
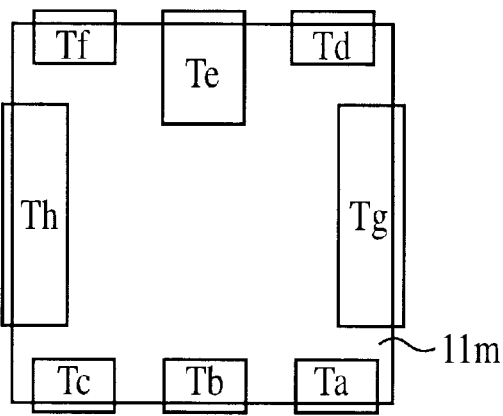
FIG. 5F shows a bottom plan view of the thirteenth dielectric layer constituting a laminated body of the composite filter in FIG. 2.

In FIGS. 2 and 3, an exploded view in perspective of the composite filter 10 in FIG. 1 and a cross-sectional view taken on line III—III of FIG. 2 are shown. The composite filter 10 includes a laminated body 11 having the LC filter F12 (not illustrated) in its inside, and on the surface, that is, one major surface of the laminated body 11 a concave portion 12 is given. Further, in the concave portion 12 of the laminated body 11 the surface acoustic wave filter F11 is arranged, and the concave portion 12 is completely sealed by making a metal cover 13 contact in an intimate way with and fixed on the surface of the laminated body 11.

Further, there are given external terminals Ta through Tc over the side surface neighboring a first edge on the back side of the laminated body 11 from the vicinity of the first edge, external terminals Td through Tf over the side surface neighboring a second edge facing the first edge on the back side from the vicinity of the second edge, an external terminal Tg over the side surface neighboring a third edge perpendicular to the first edge on the back side from the vicinity of the third edge, and an external terminal Th over the side surface neighboring a fourth edge facing the third edge on the back side from the vicinity of the fourth edge.

In FIGS. 4A through 4H and FIGS. 5A through 5F, the drawings of the top view and the bottom view of each of the dielectric layers constituting the laminated body 11 in the composite filter 10 (FIGS. 2 and 3) are shown. The laminated body 11 is formed by laminating the dielectric layers 11a through 11m of the first through the thirteenth dielectric layer from top in succession.

In the first and second dielectric layers of 11a and 11b, there are provided opening portions 14a, 14b which result in the concave portion 12 on the surface of the laminated body 11 provided. Further, on the upper surface of the sixth through tenth and the twelfth dielectric layers of 11f through 11j and 11l, capacitance's electrodes C11 through C22 made up of conductor layers are formed by printing respectively. Furthermore, on the upper surface of the fifth dielectric layer 11e, strip electrodes L11, L12 made up of conductor layer nearly of a straight line are formed by printing respectively.

Also, on the upper surface of the first through the fourth, the eleventh, and the thirteenth dielectric layers of 11a through 11d, 11k, and 11m, ground electrodes G11 through G17 made up of a conductor layer are formed by printing respectively. Further, the ground electrode G11 in the first dielectric layer 11a also functions as the base to attach the cover for sealing the concave portion 12 of the laminated body 11 to the laminated body 11, and the concave portion 12 is sealed by the cover 13 by means of attaching the cover 13 to the concave portion 12 by adhesive such as soldering, etc.

Furthermore, on the lower surface (FIG. 4F) of the twelfth dielectric layer 11m, the external terminals Ta, Tc, Td, Tf (FIG. 2) constituting the first through the fourth ports P1 through P4, and the external terminals Tb, Te, Tg, Th (FIG. 2) constituting the ground terminals are formed by printing. Further, on the first through the eleventh dielectric layer, at fixed positions, electrodes VHa through VHk are formed to connect the capacitor's electrodes C11 through C22, strip electrodes L11, L12, and ground electrodes G1 through G17.

And the capacitor C1 (FIG. 1) in the LC filter F12 is made up of the capacitor's electrodes C15, C19, C21, and ground electrodes G15 through G17, the capacitor C2 (FIG. 2) in the LC filter F12 of the capacitor's electrodes C16, C20, C22, and ground electrodes G15 through G17, the capacitor C3 (FIG. 1) in the LC filter F12 of the capacitor's electrodes C13, C15, C17, C19, the capacitor C4 (FIG. 1) in the LC filter F12 of the capacitor's electrodes C14, C16, C18, C20, and the capacitor C5 (FIG. 1) in the LC filter F12 of the capacitor's electrodes C1, C12, C13, C14 respectively.

Further, the transmission line L1 (FIG. 1) in the LC filter F12 is made up of a strip electrode L11, and the transmission line L2 (FIG. 1) is made up of a strip electrode L12 respectively.

By arrangement of a surface acoustic wave filter F11 in the concave portion 12 formed on the surface of the laminated body 11 as constructed above, the surface acoustic wave filter F11 and the LC filter F12 included inside the laminated body 11 have been integrated through one laminated body 11.

Figure 6:
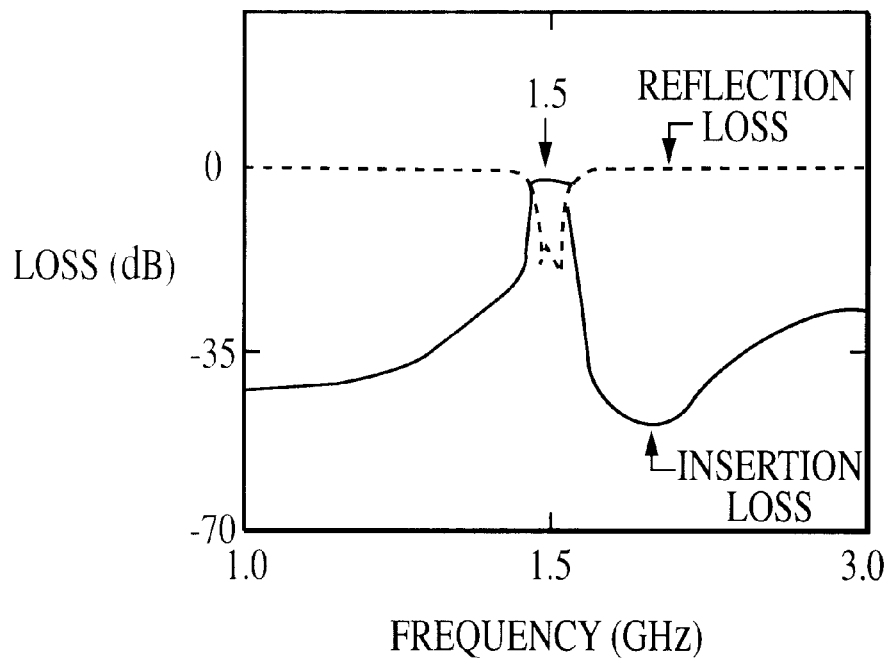
FIG. 6 shows an insertion loss and a reflection loss between a first port and a second port in the composite filter in FIG. 1.
Figure 7:
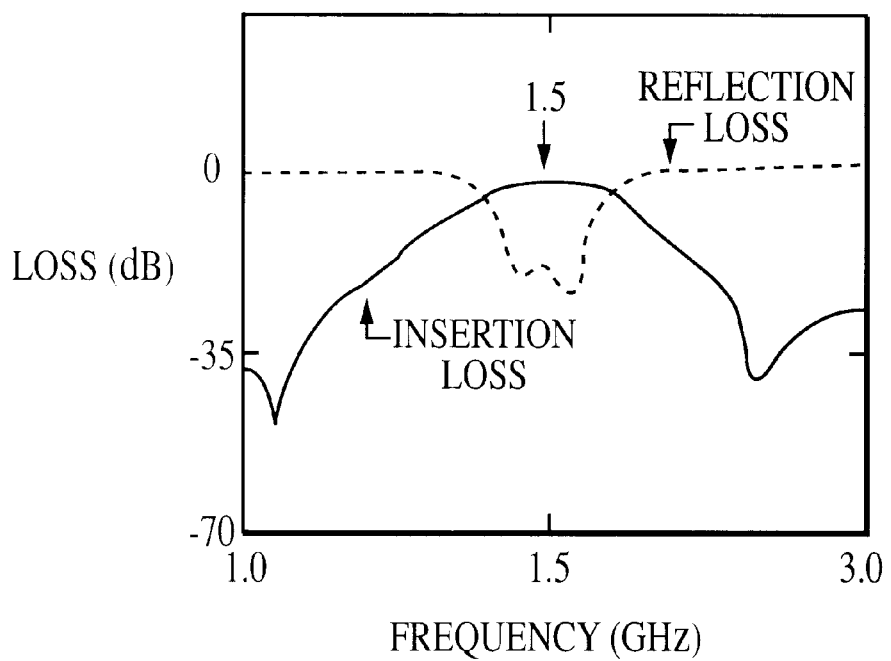
FIG. 7 shows an insertion loss and a reflection loss between a third port and a fourth port in the composite filter in FIG. 1.

Here, an insertion loss and a reflection loss between the first port P1 and the second port P2 (surface acoustic wave filter F11) and between the third port P3 and the fourth port P4 (LC filter F12) in the composite filter 10 are shown in FIGS. 6 and 7. In FIGS. 6 and 7, the solid line shows the insertion loss, and the broken line shows the reflection loss.

From these drawings, it is understood that the surface acoustic wave filter F11 between the first port P1 and second port P2 and the LC filter F12 between the third port P3 and fourth port P4 function nearly as discrete chip parts. This shows that the interference between the surface acoustic wave filter F11 and the LC filter F12 is fully suppressed even if the surface acoustic wave filter F11 and the LC filter F12 are integrated through one laminated body 11.

Based on a composite filter according to the above-mentioned embodiment, because the surface acoustic wave filter and LC filter are integrated through one laminated body, the number of parts can be reduced and the assembly process is also able to be made easy, and further nearly the same functions as when using discrete chip parts can be fulfilled.

Further, a composite filter having two functions of a surface acoustic wave filter and an LC filter in the size of 3.8 mm (L)×3.8 mm (W)×2.0 mm (H) which is as large as a surface acoustic wave filter of a conventional discrete chip part, can be obtained.

Furthermore, because the surface acoustic wave filter and the LC filter are equipped with their own input and output terminals, between the surface acoustic wave filter and the LC filter other electronic parts can be inserted. Therefore, the freedom of designing can be widened. For example, in FIG. 8, the use of a surface acoustic wave filter F11 of the composite filter 10 instead of the band-pass filter F1 and of an LC filter F12 of the composite filter 10 instead of the band-pass filter F2 of the transmitting RF portion Tx, or the use of a surface acoustic wave filter F11 of the composite filter 10 instead of the band-pass filter F2 and of an LC filter F12 of the composite filter 10 instead of the low-pass filter F3 of the transmitting RF portion Tx, or the use of a surface acoustic wave filter F11 of the composite filter 10 instead of the band-pass filter F4 and of an LC filter F12 of the composite filter 10 instead of the band-pass filter F5 of the receiving RF portion, or others can be considered.

Also, because both of the surface acoustic wave filter and the LC filter constituting the composite filter are band-pass filters, the arrangement of one filter behind another filter is able to make the attenuation value larger in the frequency range outside the pass band. Consequently, it is possible to make the attenuation value larger in a relatively wide band.

Further, when the pass band of an LC filter includes the pass band of a surface acoustic wave filter, if the LC filter having a wider pass band than the surface acoustic wave filter is arranged behind the surface acoustic wave filter having the narrow band, the attenuation value can be much larger at the frequencies outside the pass band of the surface acoustic wave filter because the high-frequency signal passes through the LC filter after having passed through the surface acoustic wave filter. Accordingly, the attenuation value can be much larger over a relatively broad band.

Furthermore, by using a surface acoustic wave filter and an LC filter constituting a composite filter as a filter constituting a transmitting RF portion or a receiving RF portion of a radio communication apparatus, the number of parts constituting the radio communication apparatus can be reduced. Accordingly, the radio communication apparatus can be small-sized.

Figure 8:
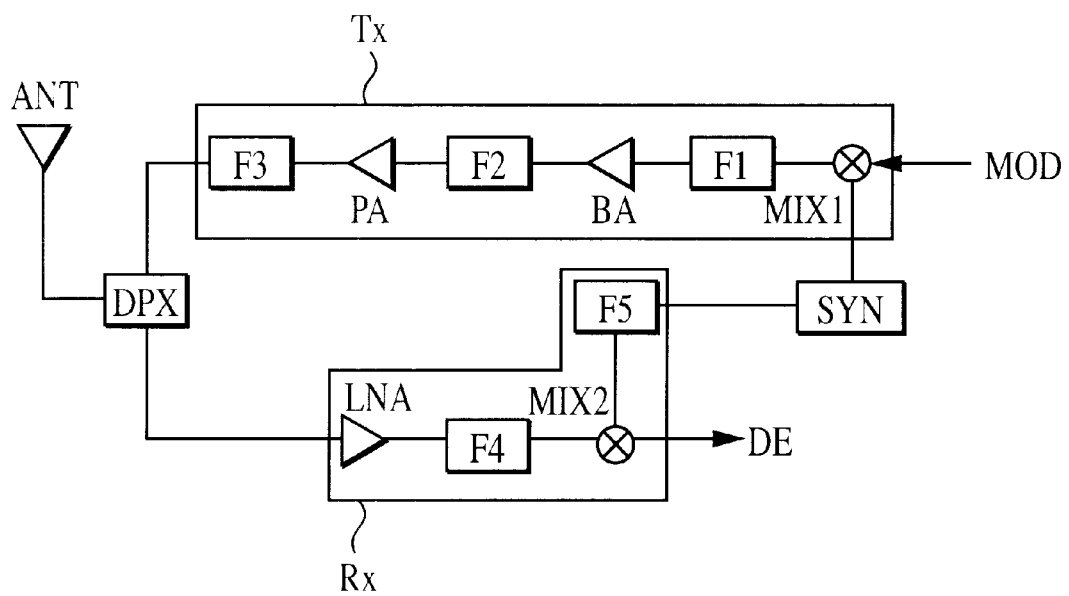
FIG. 8 is a conventional RF block diagram of a portable telephone terminal.

For example, in FIG. 8, if a surface acoustic wave filter F11 (intermediate frequency: 1.5 (GHz)) of a composite filter 10 as shown in FIG. 6 is used as a band-pass filter F1 allowing a transmission frequency to pass through and an LC filter F12 (intermediate frequency: 1.5 (GHz)) of a composite filter as shown in FIG. 7 is used as a band-pass filter F2 allowing a transmission frequency to pass through, that is, if an external terminal Ta (a first port P1) of the composite filter 10 is connected to the output of a mixer MIX1, an external terminal Td (a second port P2) to the input of a buffer amplifier BA, an external terminal Tc (a third port P3) to the output of a buffer amplifier BA, and an external terminal Tf (a fourth port P4) to the input of a high output amplifier PA respectively, a portable telephone terminal for PDC (Personal Digital Cellular) becomes small-sized.

More, in the above-mentioned embodiments, the surface acoustic wave filter and the LC filter both constitute band-pass filters, but a low-pass filter, a high-pass filter, or a band-stop filter results in the same effect.

Moreover, the case where the pass band of an LC filter includes the pass band of a surface acoustic wave filter was explained, but even if the pass band of an LC filter does not overlap with the pass band of a surface acoustic wave filter both of the filters can be used. In this case, because both filters can be used in the case where different frequencies are allowed to pass through, the freedom of application of a composite filter can be widened. For example, in FIG. 8, a surface acoustic wave filter F11 of the composite filter can be used as a band-pass filter F4 of a receiving RF portion Rx which allows an intermediate frequency to pass through and an LC filter F12 of the composite filter 10 can be used as a band-pass filter F5 which allows a receiving frequency to pass through.

While the invention has been particularly shown and described with reference to preferred embodiments thereof, it will be understood by those skilled man in the art that the foregoing and other changes in form and details may be made therein without departing from the spirit of the invention.

What is claimed is:

1. A composite filter, comprising:
   a laminated body comprising a dielectric layer and an electric conductor layer laminated together;
   a concave portion provided on at least one major surface of said laminated body;
   external terminals provided on at least a side surface of said laminated body;
   an LC filter comprising an inductance element and a capacitance element which are formed by respective parts of said electric conductor layer of said laminated body;
   a surface acoustic wave (SAW) filter arranged in said concave portion of said laminated body;
   a cover sealing said concave portion;
   two of said external terminals constituting input terminals of said surface acoustic wave filter and of said LC filter respectively, and another two of said external terminals constituting output terminals of said surface acoustic wave filter and of said LC filter respectively; and
   said surface acoustic wave filter and said LC filter being electrically independent and not electrically connected to each other within said laminated body.

2. The composite filter according to claim 1, wherein said surface acoustic wave filter and said LC filter are band-pass filters.

3. The composite filter according to claim 2, wherein the pass band of said LC filter includes the pass band of said surface acoustic wave filter.

4. The composite filter according to claim 2, wherein the pass band of said surface acoustic wave filter is non-overlapping with the pass band of said LC filter.

5. The composite filter according to claim 1, wherein said LC filter and said SAW filter have respective pass bands, and the pass band of said LC filter includes the pass band of said surface acoustic wave filter.

6. The composite filter according to claim 1, wherein said LC filter and said SAW filter have respective pass bands, and the pass band of said surface acoustic wave filter is non-overlapping with the pass band of said LC filter.

7. A radio communication apparatus, comprising:
- an RF transmitting portion including a first filter, and an RF receiving portion including a second filter; and
- a composite filter comprising:
- a laminated body comprising a dielectric layer and an electric conductor layer laminated together;
- a concave portion provided on at least one major surface of said laminated body;
- external terminals provided on at least a side surface of said laminated body;
- an LC filter comprising an inductance element and a capacitance element which are formed by respective parts of said electric conductor layer of said laminated body;
- a surface acoustic wave (SAW) filter arranged in said concave portion of said laminated body;
- a cover which seals said concave portion;
- two of said external terminals constituting input terminals of said surface acoustic wave filter and of said LC filter respectively, and another two of said external terminals constituting output terminals of said surface acoustic wave filter and of said LC filter respectively; and
- said surface acoustic wave filter and said LC filter being electrically independent and not electrically connected to each other within said laminated body;
- wherein one of said first and second filters is provided by one of said LC filter and said SAW filter.

8. The apparatus according to claim 7, wherein said LC filter and said SAW filter have respective pass bands, and the pass band of said surface acoustic wave filter is non-overlapping with the pass band of said LC filter.

9. The apparatus according to claim 7, wherein said one of said first and second filters is provided by both said LC filter and said SAW filter.

10. The apparatus according to claim 7, wherein said first filter is provided by both of said LC and SAW filters.

11. The apparatus according to claim 7, wherein said second filter is provided by both of said LC and SAW filters.

12. The apparatus according to claim 7, wherein said surface acoustic wave filter and said LC filter are band-pass filters.

13. The apparatus according to claim 12, wherein the pass band of said LC filter includes the pass band of said surface acoustic wave filter.

14. The apparatus according to claim 12, wherein the pass band of said surface acoustic wave filter is non-overlapping with the pass band of said LC filter.

15. The apparatus according to claim 7, wherein said LC filter and said SAW filter have respective pass bands, and the pass band of said LC filter includes the pass band of said surface acoustic wave filter.

* * * * *